(12) United States Patent
Inaba

(10) Patent No.: US 11,557,495 B2
(45) Date of Patent: Jan. 17, 2023

(54) COATING FILM FORMING METHOD

(71) Applicant: Tokyo Electron Limited, Tokyo (JP)

(72) Inventor: Shogo Inaba, Koshi (JP)

(73) Assignee: Tokyo Electron Limited, Tokyo (JP)

( * ) Notice: Subject to any disclaimer, the term of this patent is extended or adjusted under 35 U.S.C. 154(b) by 179 days.

(21) Appl. No.: 16/735,902

(22) Filed: Jan. 7, 2020

(65) Prior Publication Data

US 2020/0234979 A1 Jul. 23, 2020

(30) Foreign Application Priority Data

Jan. 18, 2019 (JP) .............................. JP2019-007290

(51) Int. Cl.
*H01L 21/67* (2006.01)
*B05C 11/08* (2006.01)
*H01L 21/02* (2006.01)
*G03F 7/16* (2006.01)
*B05D 1/00* (2006.01)

(52) U.S. Cl.
CPC .......... *H01L 21/6715* (2013.01); *B05C 11/08* (2013.01); *B05D 1/005* (2013.01); *G03F 7/162* (2013.01); *H01L 21/02282* (2013.01)

(58) Field of Classification Search
CPC ... B05D 1/005; G03F 7/162; H01L 21/02282; H01L 21/6715; B05C 11/08
USPC ........................................................ 427/240
See application file for complete search history.

(56) References Cited

U.S. PATENT DOCUMENTS

| 4,800,836 A * | 1/1989 | Yamamoto .............. G03F 7/162 118/52 |
| 6,533,864 B1 * | 3/2003 | Matsuyama ........ H01L 21/6715 118/704 |
| 2002/0134304 A1 * | 9/2002 | Kobayashi .......... H01L 21/6715 118/504 |
| 2002/0136828 A1 * | 9/2002 | Hung ................ H01L 21/68792 118/504 |
| 2003/0092261 A1 * | 5/2003 | Kondo .................... B24B 49/16 257/E21.174 |

(Continued)

FOREIGN PATENT DOCUMENTS

| JP | 2015-109306 A | 6/2015 |
| JP | 2017-092392 A | 5/2017 |
| JP | 2017092392 | * 5/2017 |

OTHER PUBLICATIONS

Office Action dated Sep. 6, 2022 issued in corresponding JP Patent Application No. 2019-007290.

*Primary Examiner* — Brian K Talbot
(74) *Attorney, Agent, or Firm* — Posz Law Group, PLC

(57) ABSTRACT

A coating film forming method includes: rotating a substrate at a first rotation speed in a coating cup with an upper surface open, and supplying and diffusing a coating solution for forming a coating film on the substrate; and after the supplying and diffusing the coating solution, drying the substrate by exhausting air through a gap between an annular member arranged above the substrate with centers thereof being located on a same axis and the front surface of the substrate, while rotating the substrate at a second rotation speed lower than the first rotation speed, wherein at the drying the substrate, a flow velocity of the air exhausted through the gap is higher than a flow velocity of air supplied from above the substrate in the coating cup to the substrate.

7 Claims, 5 Drawing Sheets

(56) References Cited

U.S. PATENT DOCUMENTS

| | | | |
|---|---|---|---|
| 2004/0180142 A1* | 9/2004 | Kobayashi | H01L 21/6715 118/52 |
| 2015/0004311 A1* | 1/2015 | Ichino | G03F 7/162 118/52 |
| 2015/0155197 A1* | 6/2015 | Tachibana | H01L 21/68742 438/782 |
| 2017/0140929 A1* | 5/2017 | Yoshihara | G03F 7/162 |
| 2018/0253007 A1* | 9/2018 | Kodama | G03F 7/162 |

* cited by examiner

COATING FILM FORMING METHOD

CROSS REFERENCE TO RELATED APPLICATIONS

This application is based upon and claims the benefit of priority of the prior Japanese Patent Application No. 2019-007290, filed in Japan on Jan. 18, 2019, the entire contents of which are incorporated herein by reference.

BACKGROUND OF THE INVENTION

1. Field of the Invention

This disclosure relates to a coating film forming method and a coating film forming apparatus.

2. Description of the Related Art

In a manufacturing process of a semiconductor device, a film forming treatment is performed by applying various coating solutions such as a resist on a semiconductor wafer (hereinafter, described as a wafer) being a circular substrate. In Japanese Laid-open Patent Publication No. 2017-92392, it is stated that for drying the resist applied on the wafer, an annular member along the periphery of the wafer is arranged above the wafer to straighten an airflow on the wafer.

SUMMARY OF THE INVENTION

A technique according to this disclosure speedily forms a coating film having a film thickness excellent in uniformity within a plane of a substrate.

An aspect of this disclosure is a coating film forming method of forming a coating film on a front surface of a substrate, the coating film forming method including: rotating the substrate at a first rotation speed in a coating cup with an upper surface open, and supplying and diffusing a coating solution for forming the coating film on the front surface of the substrate; and after the supplying and diffusing the coating solution, drying the substrate by exhausting air through a gap between an annular member arranged above the substrate with centers thereof being located on a same axis and the front surface of the substrate, while rotating the substrate at a second rotation speed lower than the first rotation speed, wherein the annular member has such a size that an outer peripheral edge thereof is located at a same position as a position of an outer peripheral edge of the substrate or located further outside the position of the outer peripheral edge of the substrate, and wherein at the drying the substrate, a flow velocity of the air exhausted through the gap is made higher than a flow velocity of air supplied from above the substrate in the coating cup to the substrate.

The technique according to this disclosure can speedily form a coating film having a film thickness excellent in uniformity within a plane of a substrate.

DETAILED DESCRIPTION OF THE INVENTION

Figure 1:
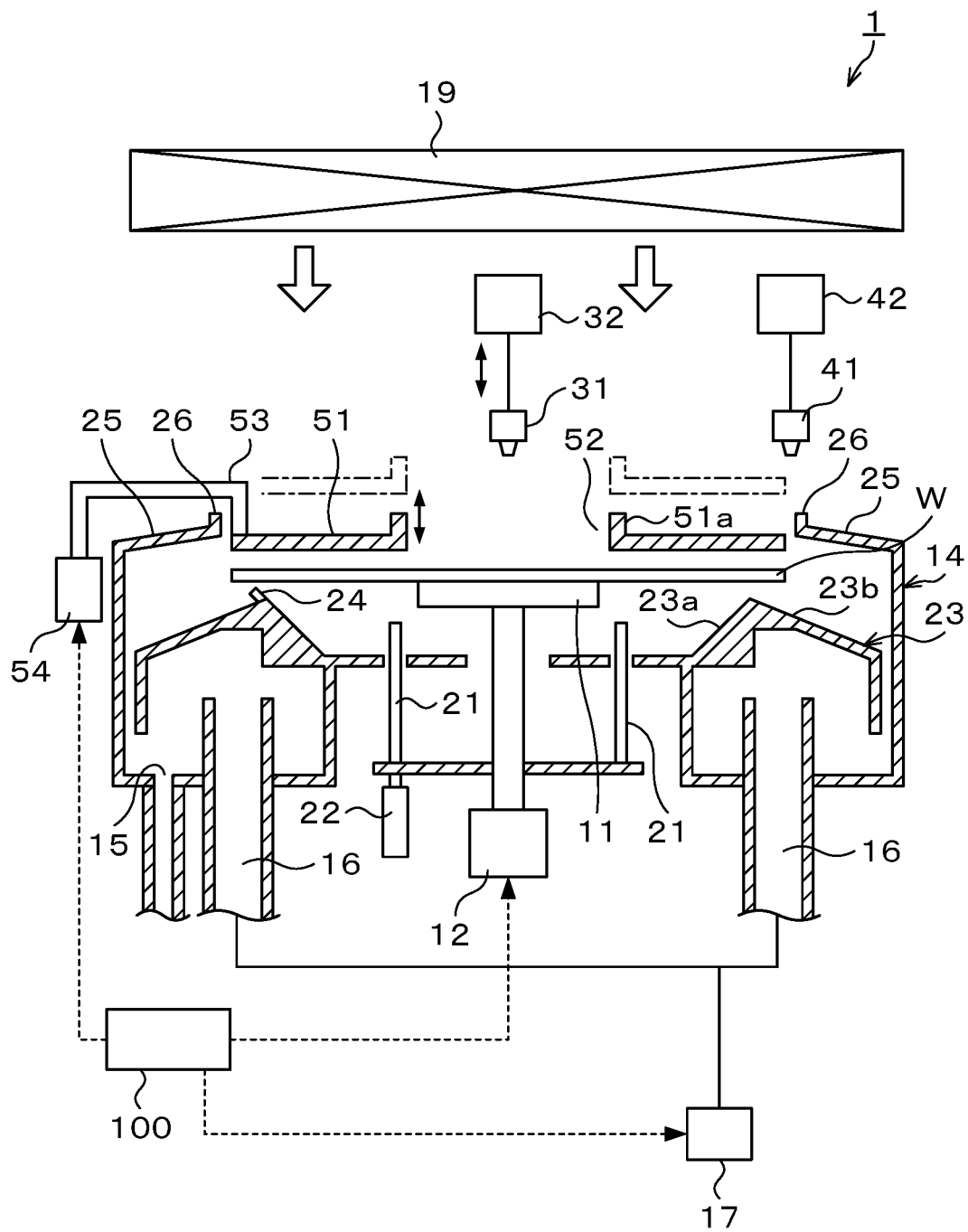
FIG. 1 is an explanatory view schematically illustrating a longitudinal cross section side of a side surface of a resist film forming apparatus being an embodiment.

The technique disclosed in Japanese Laid-open Patent Publication No. 2017-92392 includes supplying a coating solution to a central portion of a substrate and rotating the substrate at a first rotation speed to spread the coating solution by a centrifugal force, then decreasing the speed of the substrate from the first rotation speed to a second rotation speed, and rotating the substrate at the second rotation speed to smooth the front surface of a solution film of the coating solution. Thereafter, the substrate is rotated at a third rotation speed higher than the second rotation speed to be dried. In the rotating the substrate at the third rotation speed to dry the front surface of the substrate, an annular member formed in an annular shape along a circumferential direction of the substrate is installed at a position covering an upper part of the peripheral edge of the substrate so that the annular member straightens an airflow above the peripheral edge of the substrate.

However, in a process of applying a coating solution having a high viscosity (for example, about 300 cP) to a pattern of a high aspect ratio such as, for example, a 3D-NAND device, a difference in film thickness of a recess tends to increase in a radial direction, so that a further improvement has been awaited. On the other hand, there is such a problem at the drying step that when the rotation speed is decreased in order to improve the uniformity in film thickness, the drying time increases.

The technique according to this disclosure further improves the uniformity in film thickness and realizes a further reduction in drying time than before even when a coating solution of a high viscosity is applied to a pattern having a high aspect ratio.

Hereinafter, a configuration of a substrate treatment apparatus according to an embodiment will be explained referring to the drawings. Note that in this specification, the same codes are given to components having substantially the same functional configurations to omit duplicated explanation.

FIG. 1 schematically illustrates a cross section of a side surface of a resist film forming apparatus 1 as a coating film forming apparatus in the embodiment. The resist film forming apparatus 1 includes a spin chuck 11 being a substrate holder which vacuum-sucks a center of a rear surface of a wafer W being a circular substrate having a diameter of, for example, 300 mm to horizontally hold the wafer W. The spin chuck 11 is connected to a rotation mechanism 12 and rotates around a vertical axis by the rotation mechanism 12. Further, a cup 14 as a coating cup which prevents splashing of various treatment solutions such as a coating solution and a solvent from the wafer W is provided to surround the wafer W held on the spin chuck 11. At a bottom of the cup 14, a drain port 15 opens. Further, at the bottom of the cup 14, an exhaust pipe 16 is provided so that air inside the cup 14 is exhausted by an exhauster 17 connected to the exhaust pipe 16 during the treatment of the wafer W. By exhausting the air inside the cup 14, air on the front surface of the wafer W is exhausted from the surroundings of the wafer W.

In the surroundings of the spin chuck 11, raising and lowering pins 21 are arranged. The raising and lowering pins 21 can vertically rise and lower by a raising and lowering mechanism 22, and support and raise and lower the wafer W. Thus, the wafer W can be delivered between the spin chuck 11 and a not-illustrated substrate transfer mechanism.

Above the cup 14 with an upper surface open, a fan filter unit (FFU) 19 is provided which supplies clean air to the wafer W placed on the spin chuck 11. The air supplied to the wafer W is exhausted from the inside of the cup 14 through the aforementioned exhaust pipe 16.

In the surroundings of the spin chuck 11, an annular guide member 23 having inclined surface portions 23a, 23b on the inside and outside is arranged. At a top of the guide member 23, a rear surface cleaning nozzle 24 is provided. The rear surface cleaning nozzle 24 discharges a solvent for the resist solution to a peripheral edge of the rear surface of the wafer W to clean the rear surface.

On the upper surface side of the cup 14, an annular inclined surface portion 25 inclined downward toward the outside is provided, and an inner peripheral edge of the inclined surface portion 25 is formed, on its upper side, with an annular projection 26 which is vertically formed.

The resist film forming apparatus 1 includes a resist solution supply nozzle 31 which discharges a resist, for example, vertically downward. The resist solution supply nozzle 31 is connected to a resist supply mechanism 32 which stores a resist solution. The resist supply mechanism 32 includes a pump, a valve and so on to supply the resist solution to the resist solution supply nozzle 31. In this embodiment, the viscosity of the resist solution stored in the resist supply mechanism 32 is, for example, 50 cP to 900 cP.

Figure 2:
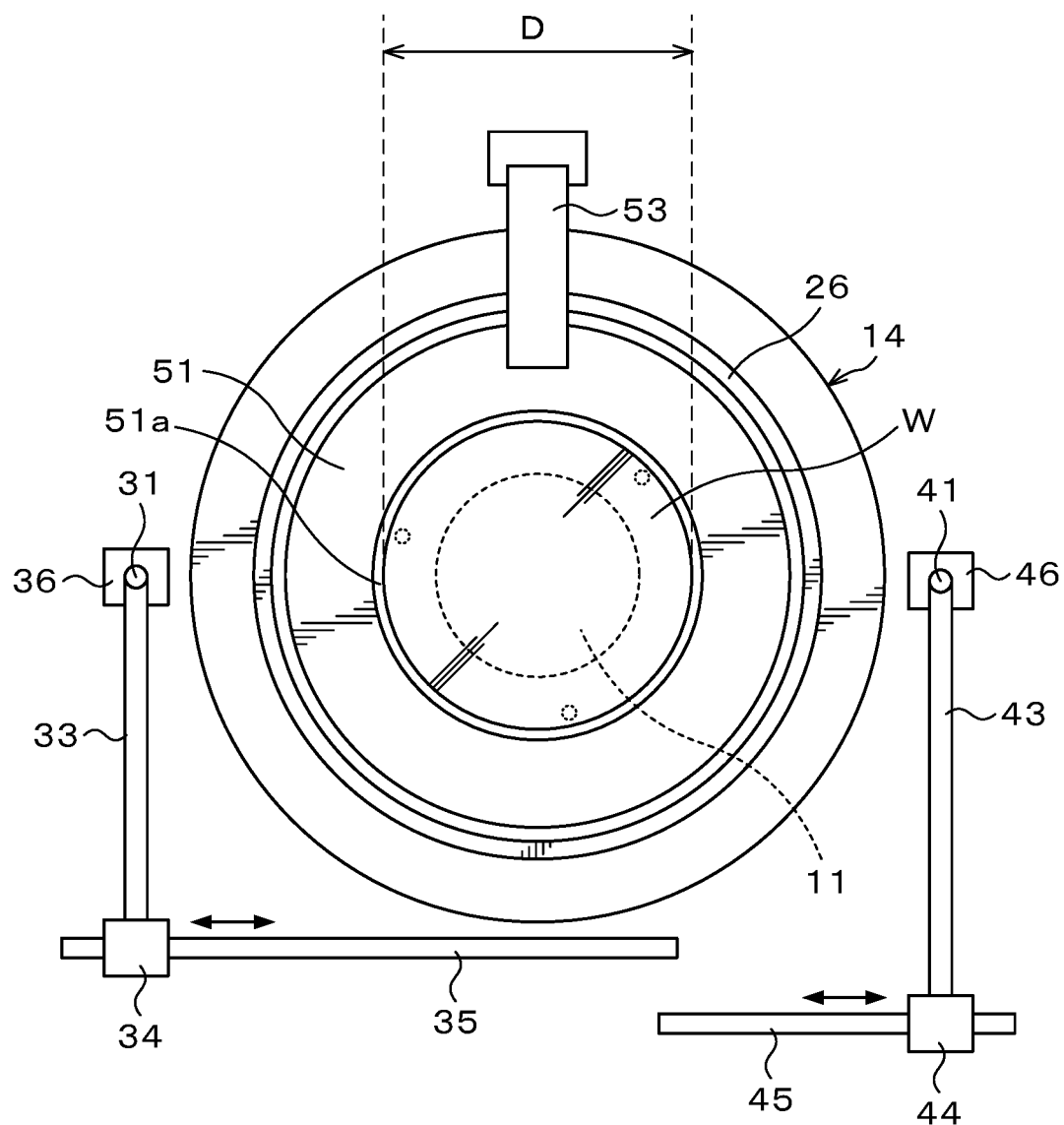
FIG. 2 is a plan view of the resist film forming apparatus in FIG. 1.

The resist solution supply nozzle 31 is supported at a tip end of an arm 33 as illustrated in FIG. 2, and the arm 33 is connected, on its base end side, to a moving mechanism 34. The moving mechanism 34 is movable in a direction of a reciprocation arrow in the drawing along a guide rail 35 by a drive mechanism (not illustrated) such as a motor. Further, the resist solution supply nozzle 31 supported by the arm 33 is movable in a vertical direction. The resist solution supply nozzle 31 can stand by at a standby part 36 arranged outside the cup 14.

The resist film forming apparatus 1 includes a solvent supply nozzle 41 which discharges the solvent, for example, vertically downward. The solvent supply nozzle 41 is connected to a solvent supply mechanism 42 which stores the solvent, and the solvent is supplied from the solvent supply mechanism 42 to the solvent supply nozzle 41. The solvent supply nozzle 41 is used for removing an unnecessary resist film at the peripheral edge of the wafer W.

The solvent supply nozzle 41 is supported at a tip portion of an arm 43, and the arm 43 is connected, on its base end side, to a moving mechanism 44. The moving mechanism 44 is movable in a direction of a reciprocation arrow in the drawing along a guide rail 45 by a drive mechanism (not illustrated) such as a motor. Further, the solvent supply nozzle 41 supported by the arm 43 is movable in a vertical direction. The solvent supply nozzle 41 can stand by at a standby part 46 arranged outside the cup 14.

In the resist film forming apparatus 1, a ring plate 51 is provided which is a circular annular member so as to be located above the wafer W placed on the spin chuck 11. At a central portion of the ring plate 51, a circular opening 52 is formed. Further, an inner diameter of the opening 52 of the ring plate 51, namely, a diameter D of the opening 52 is set, for example, to 40 mm to 200 mm. Further, a peripheral edge 51a of an inner periphery of the ring plate 51 forming the opening 52 is formed to project upward.

A lower surface of the ring plate 51 faces the wafer W placed on the spin chuck 11 to cover the wafer W. A center of the ring plate 51, namely, a center of the opening 52 coincides with the center of the wafer W placed on the spin chuck 11 in plan view. Further, the size of the ring plate 51, namely, the diameter of the ring plate 51 has the same length as or more than that of the wafer W, and is set, for example, to about 300 mm to 310 mm.

The ring plate 51 is connected to a raising and lowering mechanism 54 via a support member 53, and rises and lowers between a raised position (first position) indicated with a one-dotted chain line in FIG. 1 and a lowered position (second position) below the raised position and indicated with a solid line in FIG. 1.

Figure 3:
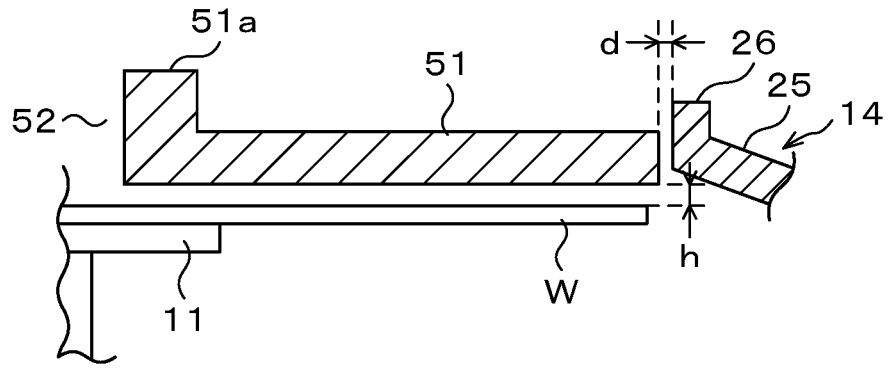
FIG. 3 is an explanatory view illustrating a relationship between a ring plate and a cup of the resist film forming apparatus in FIG. 1.

When the ring plate 51 is lowered to the second position, a gap d is formed between the projection 26 inside the cup 14 and an outer peripheral edge of the ring plate 51 as illustrated in FIG. 3. The gap d is set to be, for example, between 1 and 10 mm. Besides, when the ring plate 51 is lowered to the second position, a gap h is formed between the wafer W placed on the spin chuck 11 and the lower surface of the ring plate 51. The gap h is set to be, for example, between 1 and 10 mm. The size of the gap h is arbitrarily settable by the raising and lowering mechanism 54.

In the resist film forming apparatus 1, a controller 100 being a computer is provided. Into the controller 100, a program stored, for example, in a storage medium such as a compact disk, a hard disk, an MO (magneto-optical disk), a memory card, and a DVD is installed. The installed program has an instruction (each step) incorporated so as to transmit a control signal to each part of the resist film forming apparatus 1 to control its operation. For example, the change of the number of rotations (rotation speed) of the wafer W by the rotation mechanism 12, the movement of the resist solution supply nozzle 31 and the solvent supply nozzle 41, and the supply and stop of the resist solution from the resist supply mechanism 32 to the resist solution supply nozzle 31 are controlled. Furthermore, the raising and lowering of the ring plate 51 and the exhaust rate of the exhauster 17 are also controlled by the controller 100.

Subsequently, the wafer W to be treated in the resist film forming apparatus 1 will be explained referring to FIG. 4. A projection and recess pattern is formed on the front surface of the wafer W. A region surrounded by a broken line on the front surface of the wafer W illustrated in FIG. 4(a) is illustrated in an enlarged fashion at the destination of an arrow of a one-dotted chain line, and an example of the projection and recess pattern is displayed in the enlarged view. In this example, a plurality of grooves (recesses) 61 are formed in each of the longitudinal direction and the lateral direction so as to partition the front surface of the wafer W in a matrix form, and projections 62 are formed by the grooves 61. On upper surfaces of the grooves 61 and the projections 62, resist films 61a, 62a are formed respectively.

Figure 4:
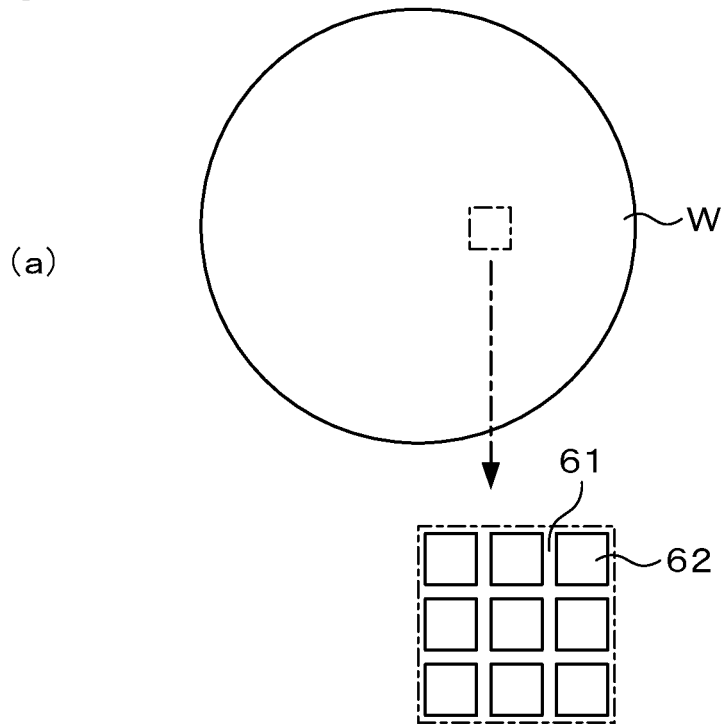
FIG. 4 is an explanatory view illustrating an example of a wafer to be treated in the resist film forming apparatus in FIG. 1.
Figure 4:
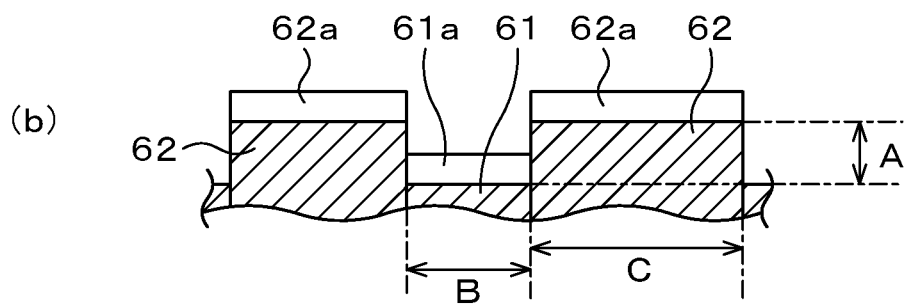

FIG. 4(b) illustrates a longitudinal sectional view of a side surface of the wafer W. A depth of the groove 61 (height of the projection 62) A is, for example, 1 µm to 20 µm and, more specifically, for example, 8 µm. A width B of the groove 61 is, for example, 10 µm to 5000 µm and, more specifically, for example, 200 µm. A width C of one side of the projection 62 is, for example, 10 µm to 5000 µm and, more specifically, for example, 2800 μm. Note that the projection and recess pattern is not limited to the shape illustrated in FIG. 4. Further, also in the case of treating a substrate formed with no projection and recess pattern, the technique of this disclosure is applicable. The aspect ratio of the recess in the projection and recess pattern to which the technique of this disclosure is applied can produce best effect, for example, at 0.01 to 0.1.

Next, a resist film forming method being an example of a coating film forming treatment using the resist film forming apparatus 1 having the above-explained configuration will be explained. First of all, the wafer W is held on the spin chuck 11, the wafer W is rotated at 1000 rpm to 3000 rpm being the first rotation speed, for example, 2000 rpm, and the resist solution is supplied from the resist solution supply nozzle 31 to the central portion of the wafer W. In this case, the ring plate 51 is located at the raised position (first position). Further, during diffusion of the resist solution over the wafer W at the first rotation speed, an exhaust pressure in the cup 14 by the exhauster 17 is set, for example, to 70 Pa.

Note that for supplying the resist solution, a so-called pre-wet method may be employed in which the solvent is supplied and diffused on the front surface of the wafer W using the solvent supply nozzle 41 before the supply of the resist solution.

Next, a drying step of the resist solution on the wafer W is performed at a low rotation of 50 rpm to 500 rpm, preferably 50 rpm to 200 rpm, being the second rotation speed lower than the first rotation speed, for example, 100 rpm. At this drying step, the ring plate 51 is located at the lowered position (second position). Then, the exhaust pressure in the cup 14 by the exhauster 17 is set, for example, to 70 Pa, and exhaust is performed by high exhaust.

The drying step is performed in this state, thereby forming a film of the resist solution on the entire surface of the wafer W. Then, the drying by such low rotation and high exhaust is performed on the wafer W after application of the resist solution, thereby achieving a more uniform film thickness and a further reduced drying time than those by the conventional low rotation drying.

Figure 5:
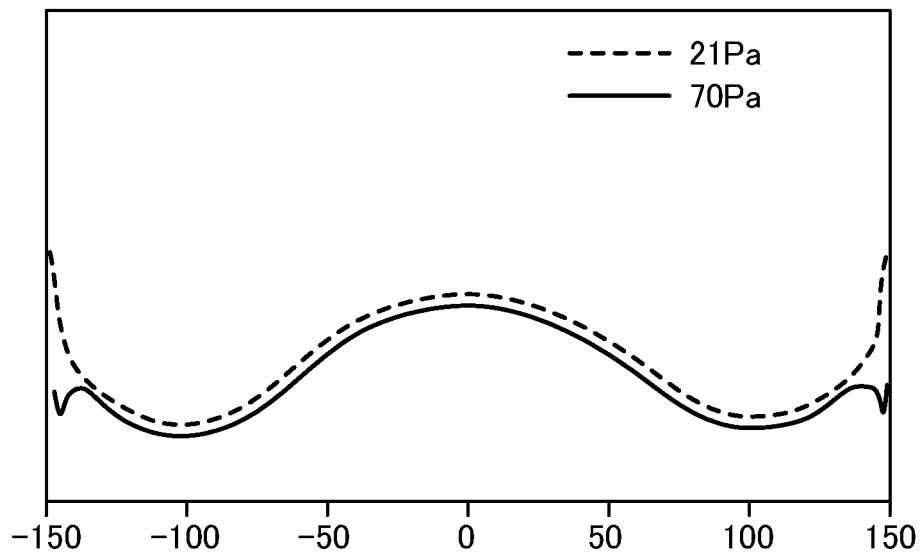
FIG. 5 is a graph illustrating a relationship between a magnitude of an exhaust rate and a film thickness distribution at the time of low rotation.

In more detail, first, the comparison in film thickness between the case of performing the drying step by low rotation-high exhaust and the case of performing the drying step by low rotation-normal exhaust, using the resist film forming apparatus 1 according to the embodiment, is illustrated in a graph of FIG. 5. The film thickness distribution illustrated in the graph is obtained without using the ring plate 51 in order to investigate the effect by high exhaust.

According to the graph, in the low rotation-normal exhaust, the exhaust pressure by the exhauster 17 is kept at 21 Pa during the performance of the drying step at a low rotation of 100 rpm. On the other hand, in the low rotation-high exhaust, the exhaust pressure by the exhauster 17 was increased from 21 Pa to 70 Pa during the performance of the drying step at a low rotation of 100 rpm. As a result of this, the increase in film thickness at the peripheral edge of the wafer W observed in the low rotation-normal exhaust is suppressed, resulting in a uniform film thickness as a whole as illustrated in FIG. 5.

Figure 6:
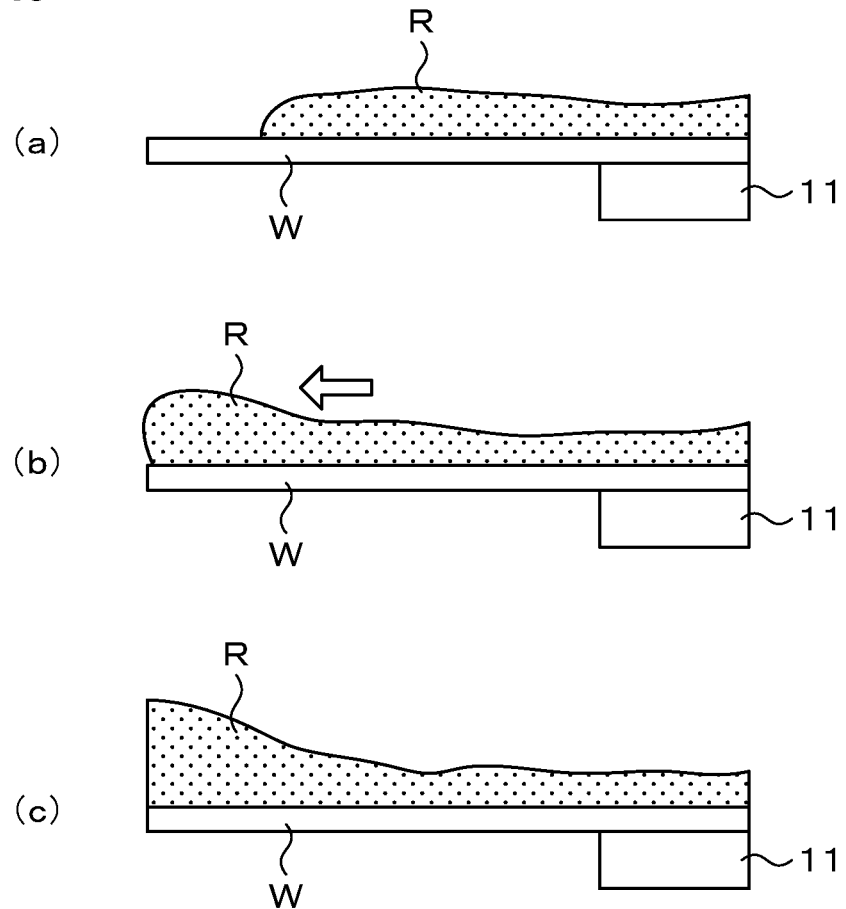
FIG. 6 is an explanatory view illustrating an appearance in which a resist solution on the wafer diffuses at the time of low rotation-normal exhaust.

The above is inferred to be caused by the following mechanism. Specifically, in the low rotation-normal exhaust, a resist solution R spreads also at the drying step as illustrated in FIG. 6(a). However, when the viscosity of the resist solution R is high (for example, 50 cP to 900 cP), the resist solution R accumulates at the outer periphery of the wafer W because the spreading of the resist solution R is weak in combination with the low rotation speed as illustrated in FIG. 6(b). The resist solution R continuously accumulates at the outer periphery until the outer periphery is dried. As a result of this, the film thickness at the outer periphery of the wafer W becomes large at the end of the drying, resulting in swelling in the resist film at the outer periphery as illustrated in FIG. 6(c).

Figure 7:
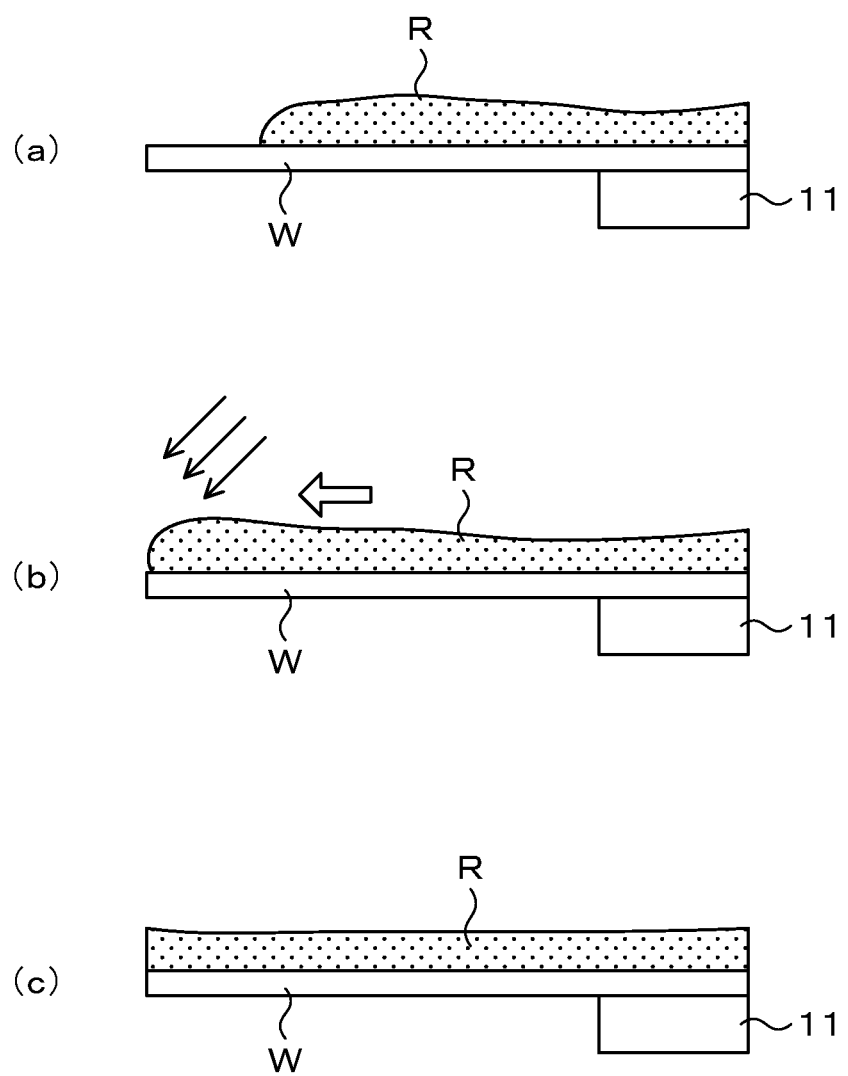
FIG. 7 is an explanatory view illustrating an appearance in which the resist solution on the wafer diffuses at the time of low rotation-high exhaust.

In contrast to the above, in the low rotation-high exhaust, the spreading of the resist solution R is the same as in the low rotation-normal exhaust as illustrated in FIG. 7(a). However, because of the high exhaust, the drying time of the resist solution on the wafer W is short, so that the accumulation amount of the resist solution R at the outer periphery is suppressed as illustrated in FIG. 7(b). As a result of this, the increase in film thickness and the swelling at the outer periphery of the wafer W are suppressed as illustrated in FIG. 7(c).

In the resist film forming method according to this embodiment, the ring plate 51 is lowered to be located at the second position at the drying step, so that the lower surface of the ring plate 51 covers the front surface of the wafer W. Therefore, the flow velocity of air on the front surface of the resist solution R on the wafer W is made faster. This results in an increase in uniformity of the film thickness and a reduction in drying time.

Further, the air supplied from the fan filter unit (FFU) 19 enters from the opening 52 of the ring plate 51, namely, from above the central portion of the wafer W to increase the flow velocity of the air as explained above, and flows to the outer periphery. Thus, if there is a concern about an influence of the difference in flow velocity on the variation in film thickness between the center side and the outer peripheral side of the wafer W, the center of the opening 52 may be displaced from the center of the wafer W placed on the spin chuck 11 in plan view.

By the displacement, the radial position of the wafer W corresponding to below the opening 52 changes accompanying the rotation of the wafer W, so that it is considered that the influence of the difference in flow velocity of air on the film thickness is smoothed out and reduced by the treatment while rotating the wafer W. In this case, in place of arranging the opening 52 so that its center is displaced from the center of the wafer W, a cutout may be provide at a part of the opening portion of the ring plate 51, or a plate in a shape having a portion cutout from the outer periphery may be employed in place of the ring plate 51.

In the investigation by the inventor, in comparison with the case of the low rotation-normal exhaust in which the ring plate 51 was lowered to be located at the second position at the drying step, the uniformity in film thickness was able to be improved by about 40% in the case of the low rotation-high exhaust. Besides, in comparison with the case of the low rotation-normal exhaust in which the ring plate 51 was lowered to be located at the second position at the drying step, the drying time was able to be reduced by 20% in the case of the low rotation-high exhaust.

Note that the high exhaust mentioned here is exhaust performed at an exhaust pressure higher than the exhaust pressure of the normal exhaust by the exhauster 17 at the coating and diffusing step and refers to, for example, exhaust performed at a pressure equal to or higher than twice the exhaust pressure of the normal exhaust.

In more investigation by the inventor, it has been found out that the gap d between the projection 26 inside the cup 14 and the outer edge of the ring plate 51 and the gap h between the wafer W placed on the spin chuck 11 and the lower surface of the ring plate 51 at the drying step influence the uniformity in film thickness and the drying time.

In other words, it has been found out that when the gap d decreases, the uniformity in film thickness deteriorates, but the drying time can be reduced. However, even if the gap d is decreased and set to be, for example, 5 mm, the uniformity in film thickness is not improved when the exhaust is kept at the low exhaust. On the other hand, it has been found out that when the value of the gap h is increased, the drying time increases.

From the above findings, such knowledge has been obtained that when improving the uniformity in film thickness and reducing the drying time, the best result can be obtained by well balancing the flow velocities of the air flowing through the gap d and the air flowing through the gap h in exhaust. Accordingly, it is preferable that the size of each of the gap d and the gap h is set to a range of 1 to 10 mm and the gap d and the gap h are substantially the same size.

Since the most suitable sizes of the gap d and the gap h vary, as a matter of course, depending on the kind and the viscosity of the coating solution, the sizes of the gap d and the gap h are appropriately adjusted, thereby enabling achievement of the best uniformity in film thickness and the reduction in drying time. Further, since the tolerance of the uniformity in film thickness varies depending on the recipe, the sizes of the gap d and the gap h are appropriately adjusted when the drying time is reduced in the tolerance, thereby enabling control of the uniformity in film thickness and the reduction in drying time.

Note that regarding the normal exhaust and the high exhaust, the exhaust pressure at the time of supply and diffusion of the resist solution is set to the normal exhaust and the exhaust by the exhaust pressure higher than that is set to the high exhaust by adjusting the exhaust pressure by the exhauster 17 as explained above, but another parameter may be used.

More specifically, at the drying step, the exhaust may be performed so that the flow velocity of the air exhausted through the gap h is higher by twice or more, more preferably, triple to quintuple the flow velocity of the air supplied to the wafer W in the cup 14 from above by the fan filter unit (FFU) 19. Note that the flow velocity of the air flowing through the gap h mentioned here is the flow velocity of the air flowing in a radial direction of the wafer W.

The embodiment disclosed this time is an example but should not be considered to be restrictive in all respects. The above embodiment may be subjected to omission, replacement or change in various forms without departing from accompanying claims and the gist thereof.

Note that the following configurations also belong to the technical scope of this disclosure.

(1) A coating film forming method of forming a coating film on a front surface of a substrate, the coating film forming method including:
rotating the substrate at a first rotation speed in a coating cup with an upper surface open, and supplying and diffusing a coating solution for forming the coating film on the front surface of the substrate; and
after the supplying and diffusing the coating solution, drying the substrate by exhausting air through a gap between an annular member arranged above the substrate with centers thereof being located on a same axis and the front surface of the substrate, while rotating the substrate at a second rotation speed lower than the first rotation speed,
wherein the annular member has such a size that an outer peripheral edge thereof is located at a same position as a position of an outer peripheral edge of the substrate or located further outside the position of the outer peripheral edge of the substrate, and
wherein at the drying the substrate, a flow velocity of the air exhausted through the gap is made higher than a flow velocity of air supplied from above the substrate in the coating cup to the substrate.

Here, at the supplying and diffusing the coating solution, the supplying and diffusing the coating solution does not always need to diffuse the coating solution over the entire surface of the substrate.

(2) The coating film forming method according to (1), wherein at the drying the substrate, the flow velocity of the air exhausted through the gap is made equal to or higher than twice the flow velocity of the air supplied from above the substrate in the coating cup to the substrate.

(3) The coating film forming method according to (1), wherein at the drying the substrate, exhaust is performed at a higher pressure than exhaust of air in the coating cup at the coating and diffusing.

(4) The coating film forming method according to (1), wherein a gap in a longitudinal direction between a portion closest to the annular member of the coating cup and the outer peripheral edge of the annular member is 1 to 10 mm, and a gap between a lower surface of the annular member and the front surface of the substrate is 1 to 10 mm.

(5) The coating film forming method according to (4), wherein the gap in the longitudinal direction between the portion closest to the annular member of the coating cup and the outer peripheral edge of the annular member and the gap between the lower surface of the annular member and the front surface of the substrate are identical.

(6) The coating film forming method according to (1) wherein the first rotation speed is 1000 rpm to 3000 rpm, and the second rotation speed is 50 rpm to 500 rpm.

(7) The coating film forming method according to (1), wherein the substrate has a projection and recess pattern formed on the front surface, and an aspect ratio of a recess in the projection and recess pattern is 0.01 to 0.1.

(8) The coating film forming method according to (1), wherein a viscosity of the coating solution is 50 cP to 900 cP.

(9) A coating film forming apparatus for forming a coating film on a front surface of a substrate, the coating film forming apparatus including:
a substrate holder configured to hold the substrate;
a rotation mechanism configured to rotate the substrate held on the substrate holder;
a coating cup configured to surround the substrate held on the substrate holder;
a nozzle configured to supply a coating solution for forming the coating film to a central portion of the front surface of the substrate;
an annular member having a diameter of a length equal to or larger than a diameter of the substrate, and arranged to be vertically movable above the substrate holder;
an exhauster configured to exhaust an atmosphere in the coating cup; and
a controller configured to cause the nozzle to supply the coating solution to the substrate held on the substrate holder and cause the rotation mechanism to diffuse the coating solution, and then control the rotation mechanism and the exhauster so as to decrease a rotation speed of the rotation mechanism and increase an exhaust flow rate by the exhauster.

What is claimed is:

1. A coating film forming method of forming a coating film on a front surface of a substrate, the coating film forming method comprising:
   rotating the substrate at a first rotation speed in a coating cup with an upper surface open, and supplying and diffusing a coating solution for forming the coating film on the front surface of the substrate; and
   after the supplying and diffusing the coating solution, drying the substrate by exhausting air through a gap between an annular member arranged above the substrate with centers thereof being located on a same axis and the front surface of the substrate, while rotating the substrate at a second rotation speed lower than the first rotation speed,
   wherein the annular member has such a size that an outer peripheral edge thereof is located at a same position as a position of an outer peripheral edge of the substrate or located further outside the position of the outer peripheral edge of the substrate, and
   wherein at the drying the substrate, a flow velocity of the air exhausted through the gap is made higher than a flow velocity of air supplied from above the substrate in the coating cup to the substrate,
   wherein a gap in a longitudinal direction between a portion closest to the annular member of the coating cup and the outer peripheral edge of the annular member is 1 to 10 mm, and a gap between a lower surface of the annular member and the front surface of the substrate is 1 to 10 mm.

2. The coating film forming method according to claim 1, wherein at the drying the substrate, the flow velocity of the air exhausted through the gap between the annular member and the front surface of the substrate is made equal to or higher than twice the flow velocity of the air supplied from above the substrate in the coating cup to the substrate.

3. The coating film forming method according to claim 1, wherein at the drying the substrate, exhaust is performed at a higher pressure than exhaust of air in the coating cup at the coating and diffusing.

4. The coating film forming method according to claim 1, wherein the gap in the longitudinal direction between the portion closest to the annular member of the coating cup and the outer peripheral edge of the annular member and the gap between the lower surface of the annular member and the front surface of the substrate are identical.

5. The coating film forming method according to claim 1, wherein the first rotation speed is 1000 rpm to 3000 rpm, and the second rotation speed is 50 rpm to 500 rpm.

6. The coating film forming method according to claim 1, wherein the substrate has a projection and recess pattern formed on the front surface, and an aspect ratio of a recess in the projection and recess pattern is 0.01 to 0.1.

7. The coating film forming method according to claim 1, wherein a viscosity of the coating solution is 50 cP to 900 cP.

* * * * *